United States Patent
Siddiqui et al.

(10) Patent No.: US 9,040,369 B2
(45) Date of Patent: May 26, 2015

(54) STRUCTURE AND METHOD FOR REPLACEMENT GATE MOSFET WITH SELF-ALIGNED CONTACT USING SACRIFICIAL MANDREL DIELECTRIC

(71) Applicant: International Business Machines Corporation, Armonk, NY (US)

(72) Inventors: Shahab Siddiqui, White Plains, NY (US); Michael P. Chudzik, Danbury, CT (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 164 days.

(21) Appl. No.: 13/752,567

(22) Filed: Jan. 29, 2013

(65) Prior Publication Data
US 2013/0143377 A1    Jun. 6, 2013

Related U.S. Application Data

(62) Division of application No. 12/795,962, filed on Jun. 8, 2010, now Pat. No. 8,373,239.

(51) Int. Cl.
*H01L 21/338* (2006.01)
*H01L 29/66* (2006.01)
*H01L 21/28* (2006.01)
*H01L 21/768* (2006.01)
*H01L 29/49* (2006.01)
*H01L 29/51* (2006.01)

(52) U.S. Cl.
CPC .... *H01L 29/66575* (2013.01); *H01L 21/28088* (2013.01); *H01L 21/76897* (2013.01); *H01L 29/4966* (2013.01); *H01L 29/51* (2013.01); *H01L 29/517* (2013.01); *H01L 29/518* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 6,030,876 A | 2/2000 | Koike | |
| 6,072,221 A | 6/2000 | Hieda | |
| 6,130,121 A | 10/2000 | Sze | |
| 6,235,620 B1 | 5/2001 | Saito et al. | |
| 6,291,278 B1 | 9/2001 | Xiang et al. | |
| 6,432,768 B1 | 8/2002 | Chien et al. | |
| 6,436,775 B2 * | 8/2002 | Kim et al. | 438/301 |
| 6,492,249 B2 | 12/2002 | Xiang et al. | |
| 6,531,736 B1 | 3/2003 | Koike | |
| 6,551,886 B1 | 4/2003 | Yu | |

(Continued)

*Primary Examiner* — Tan N Tran
*Assistant Examiner* — Scott R Wilson
(74) *Attorney, Agent, or Firm* — Scully, Scott, Murphy & Presser, P.C.; H. Daniel Schnurmann

(57) ABSTRACT

The present disclosure provides a method for forming a semiconductor device that includes forming a replacement gate structure overlying a channel region of a substrate. A mandrel dielectric layer is formed overlying source and drain regions of the substrate. The replacement gate structure is removed to provide an opening exposing the channel region of the substrate. A functional gate structure is formed over the channel region including a work function metal layer. A protective cap structure is formed over the functional gate structure. At least one via is etched through the mandrel dielectric layer selective to the protective cap structure to expose a portion of at least one of the source region and the drain region. A conductive fill is then formed in the vias to provide a contact to the at least one of the source region and the drain region.

14 Claims, 3 Drawing Sheets

(56) References Cited

U.S. PATENT DOCUMENTS

| | | |
|---|---|---|
| 6,573,132 B1 | 6/2003 | Uehara et al. |
| 6,713,826 B2 | 3/2004 | Uehara et al. |
| 6,803,318 B1 | 10/2004 | Qiao et al. |
| 6,884,715 B1 | 4/2005 | Kwon et al. |
| 6,924,198 B2 | 8/2005 | Williams et al. |
| 6,924,225 B2 | 8/2005 | Popp et al. |
| 7,026,689 B2 | 4/2006 | Liaw |
| 7,074,666 B2 | 7/2006 | Furukawa et al. |
| 7,205,232 B2 | 4/2007 | Yun et al. |
| 7,233,063 B2 | 6/2007 | Furukawa et al. |
| 7,271,439 B2 | 9/2007 | Park |
| 7,335,930 B2 | 2/2008 | Furukawa et al. |
| 7,399,671 B2 | 7/2008 | Burgess et al. |
| 7,419,898 B2 | 9/2008 | Liaw |
| 7,550,044 B2 | 6/2009 | Gaidis et al. |
| 7,563,701 B2 | 7/2009 | Chang et al. |
| 7,564,135 B2 | 7/2009 | Park |
| 2005/0153543 A1 | 7/2005 | Huang et al. |
| 2005/0250301 A1 | 11/2005 | Cabral, Jr. et al. |
| 2006/0065939 A1* | 3/2006 | Doczy et al. ............. 257/412 |
| 2007/0187727 A1* | 8/2007 | Ting et al. ............... 257/274 |
| 2008/0057720 A1* | 3/2008 | Frohberg et al. ......... 438/699 |
| 2008/0220606 A1 | 9/2008 | Cabral et al. |
| 2008/0283957 A1* | 11/2008 | Kang et al. .............. 257/499 |
| 2009/0004857 A1 | 1/2009 | Chikarmane et al. |
| 2009/0057730 A1 | 3/2009 | Furukawa et al. |
| 2009/0166759 A1 | 7/2009 | Sivakumar |
| 2009/0194825 A1 | 8/2009 | Werner et al. |

\* cited by examiner

STRUCTURE AND METHOD FOR REPLACEMENT GATE MOSFET WITH SELF-ALIGNED CONTACT USING SACRIFICIAL MANDREL DIELECTRIC

CROSS REFERENCE TO RELATED APPLICATION

This application is a divisional of U.S. patent application Ser. No. 12/795,962, filed Jun. 8, 2010 the entire content and disclosure of which is incorporated herein by reference.

BACKGROUND

The present disclosure relates to semiconductor devices. More particularly, the present disclosure relates to forming gate structures and interconnects to semiconductor devices.

Field effect transistors (FETs) are the basic building block of today's integrated circuits (ICs). Such transistors can be formed in conventional bulk semiconductor substrates (such as silicon) or in a SOI layer of a semiconductor-on-insulator (SOI) substrate. In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties.

SUMMARY

The present disclosure provides a method for forming a semiconductor device that includes forming a protective dielectric layer on sidewalls of a replacement gate structure that is present overlying a channel region of a substrate. A source region and a drain region may be formed on opposing sides of the replacement gate structure. A mandrel dielectric layer is formed overlying the source region and the drain region of the substrate. The mandrel dielectric layer has an upper surface that is coplanar with an upper surface of the replacement gate structure. The replacement gate structure is removed to provide an opening exposing the channel region of the substrate. A functional gate structure is formed over the channel region including a work function metal layer. A protective cap structure is formed over the functional gate structure. At least one via is etched through the mandrel dielectric layer selective to the protective cap structure and the protective dielectric layer to expose a portion of at least one of the source region and the drain region. A conductive fill is then formed in the vias to provide a contact to the at least one of the source region and the drain region.

In another aspect, a semiconductor device is provided that includes a gate structure that includes a work function metal layer, in which the contacts to at least one of the source and the drain region are self aligned, i.e., are not shorted to the gate structure. In one embodiment, the semiconductor device includes a gate structure. The gate structure includes a metal-containing gate conductor present on a work function metal layer, in which the work function metal layer is present on a high-k gate dielectric. The high-k gate dielectric is present on a channel portion of a substrate. A protective cap layer is present over the gate structure. A protective dielectric layer is present on sidewalls of the gate structure. Source and drain regions are present on opposing sides of the channel portion of the substrate. The semiconductor device further comprises a contact to at least one of the source and drain regions, wherein the contact is separated from the gate structure by the protective cap and the protective dielectric layer. A non-conformal stress inducing layer is present over at least the protective cap, the protective dielectric layer, and the source and drain regions.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
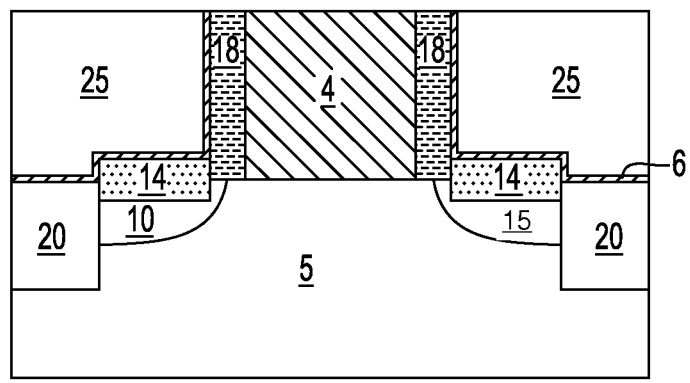
FIG. 1 is a side cross-sectional view depicting forming a replacement gate structure overlying a channel region of a substrate, forming a source region and a drain region on opposing sides of the replacement gate structure, and forming a mandrel dielectric layer overlying the source region and the drain region of the substrate, in accordance with one embodiment of the present disclosure.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to structures and methods for forming semiconductor devices including gate structures having work function metal layers present therein, in which the contacts to the source and drain regions of the device are formed using a self aligning process. The term "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor. As used herein, "p-type semiconductor" refers to the addition of trivalent impurities to a semiconductor material that create deficiencies of valence electrons, such as boron, aluminum or gallium to an intrinsic silicon substrate. As used herein, "n-type semiconductor" refers to the addition of pentavalent impurities to a semiconductor substrate that contribute free electrons, such as antimony, arsenic or phosphorous to an intrinsic Si substrate.

FIG. 1 depicts an initial structure suitable for use in one embodiment of the present disclosure. The initial structure may include a substrate 5, source region 10, drain region 15, isolation region 20, metal semiconductor alloy contact 14, a replacement gate structure 4, and protective dielectric layers 18 that are present on sidewalls of the replacement gate structure 4.

In one embodiment, the substrate 5 is a bulk substrate that may include, but is not limited to Si-containing materials, GaAs, InAs and other like semiconductors. Si-containing materials as used to provide the substrate 5 include, but are not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. The term "Si-containing materials" as used herein denotes any semiconductor material that includes silicon. Illustrative examples of various Si semiconductor materials that can be employed in the present invention include, but are not limited to Si, SiGe, SiGeC, SiC and other like Si-containing materials. The substrate 5 may also be Ge, Ge alloys, GaAs, InAs, InP as well as other III/V and II/VI compound semiconductors. Combinations of the aforementioned materials can also be used.

Although not depicted in the Figures, the substrate 5 may also be composed of a semiconductor-on-insulator substrate (SOI) which includes a bottom semiconductor-containing layer, a buried insulating layer present atop the bottom semiconductor-containing layer, and top semiconductor-containing layer (i.e., SOI layer) present atop the surface of the buried insulating layer. The bottom and top semiconductor-containing layers may be composed of a Si-containing material. In some embodiments, the buried insulating layer may be a buried oxide region.

At least one isolation region 20 may be formed in the substrate 5. The isolation region 20 may be a shallow trench isolation (STI) region formed by etching a trench into the substrate 5 and filling the trench with a dielectric material. The etching step may be performed utilizing a dry etching process, such as reactive-ion etching, ion beam etching, laser ablation or any combination thereof. Chemical vapor deposition (CVD) or another like deposition process can be used to fill the trench with an STI dielectric material, such as a high-density plasma (HDP) oxide or TEOS (tetraethylorthosilicate). The isolation region 20 may also be formed by local oxidation (LOCOS) or by an oxide mesa formation process.

Still referring to FIG. 1, a replacement gate structure 4 is formed overlying a channel region of the substrate 5. As used herein, a "replacement gate structure" is a material having a geometry and location on the substrate 5 that determines the location for the later formed functional gate structure that is substituted for the replacement gate structure once the replacement gate structure has been removed. The material that provides the replacement gate structure may be any material that can occupy the space in which the subsequently formed functional gate structure is to be positioned.

In one embodiment, the replacement gate structure 4 includes a sacrificial layer that may be composed of a semiconductor-containing material, dielectric material or may be composed of photoresist. In some embodiments, in which the replacement gate structure 4 is composed of a semiconductor-containing material, the semiconductor-containing material may be a silicon-containing material. The term "silicon-containing material" as used herein denotes any semiconductor material that includes silicon. In one example, the semiconductor-containing material that provides the replacement gate structure 4 is polysilicon. Other illustrative examples of various silicon semiconductor materials that are suitable for the replacement gate structure 4 include, but are not limited to: Si, SiGe, SiGeC, SiC and other like Si-containing materials.

The semiconductor-containing material for the replacement gate structure 4 may also be a germanium-containing material. The semiconductor-containing material may be doped or un-doped. The semiconductor-containing material may be formed using a deposition process, including but not limited to: low pressure chemical vapor deposition or room temperature chemical vapor deposition.

The replacement gate structure 4 may also be composed of a dielectric material. Examples of dielectric materials that are suitable for the replacement gate structure include nitrides, oxides or oxynitride materials. The dielectric material of the replacement gate structure 4 may be deposited by chemical vapor deposition (CVD). Variations of CVD processes suitable for depositing the replacement gate structure 4 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. In one embodiment, the replacement gate structure 4 is composed of silicon nitride. In another embodiment, the replacement gate structure 4 is composed of an oxide, such as silicon oxide.

Although not depicted in FIG. 1, the replacement gate structure 4 may also be a multi-layered structure that is composed of semiconductor-containing and dielectric layers, wherein the selection of the composition of the dielectric layers may be selected to provide etch stop layers to facilitate etching during the pattern steps that provide the replacement gate structure 4.

The material layers that provide the replacement gate structure 4 can be patterned using photolithography and etch processes. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. The term "selective" in reference to a material removal process denotes that the rate of material removal for a first material is greater than the rate of removal for at least another material of the structure to which the material removal process is being applied. The patterned resist is then removed using an $O_2$ ash process, or the patterned resist may be stripped using a wet chemical process.

In one embodiment, the replacement gate structure 4 has a width ranging from 10 nm to 20 nm and a height ranging from 40 nm to 100 nm. In yet another embodiment, the gate structure 4 has a width ranging from 15 nm to 20 nm and a height ranging from 60 nm to 80 nm. It is noted that the dimensions for the replacement gate structure are provided for illustrative purposes and are not intended to limit the present disclosure.

Still referring to FIG. 1, source regions 10 and drain regions 15 are formed on opposing sides of the replacement gate structure 4. A drain region 15 is the doped region in semiconductor device that is located at an end of the channel in which carriers are flowing out of the semiconductor device, e.g., transistor. The source region 10 is the doped region in the semiconductor device in which majority carriers are flowing into the channel. The channel is the region underlying the functional gate structure and between the source region and the drain region of a semiconductor device that becomes conductive when the semiconductor device is turned on.

In one embodiment, the source regions 10 and drain regions 15 are implanted with an n-type dopant, in which the semiconductor device is an n-type conductivity field effect transistor (nFET). In one embodiment, n-type FET devices are produced by doping the silicon-containing substrate 5 with elements from group V of the Periodic Table of Elements. In one embodiment, the group V element is phosphorus, antimony or arsenic. In one embodiment, the source regions 10 and drain regions 15 are implanted with a p-type dopant, in which the second conductivity type semiconductor device 30 is a p-type conductivity field effect transistor (nFET). P-type field effect transistor (pFET) devices are produced by doping the silicon-containing substrate 5 with elements from group III of the Periodic Table of Elements. In one embodiment, the group III element is boron, aluminum, gallium or indium.

The source regions 10 and drain regions 15 may be doped using ion implantation. Resulting dopant concentrations for the source regions 10 and drain regions 15 may range from $1\times10^{18}$ dopant atoms per cubic centimeter to $1\times10^{21}$ dopant atoms per cubic centimeter. The source regions 10 and drain regions 15 may further include extension regions and/or halo implant regions (not shown). The implants to provide the extension regions and the halo implant regions may include a combination of normally incident and angled implants to form the desired grading and implant depth.

FIG. 1 further depicts forming a protective dielectric layer 18 on the sidewalls of the replacement gate structure 4. In one embodiment, the protective dielectric layer 18 is selected to provide a material that will not be substantially etched by the etchant that provides the opening through the mandrel dielectric to the source regions 10 and drain regions 15. In one embodiment, the protective dielectric layer 18 is provided by at least one spacer. The at least one spacer may be formed on the sidewall of the replacement gate structure 4 using deposition and etch processes. In one embodiment, the at least one spacer has a width measured at the base of the at least one spacer ranging from 3 nm to 40 nm. In another embodiment, the at least one spacer has a width measured at the base of the at least one spacer ranging from 20.0 nm to 30.0 nm. Although not depicted in FIG. 1, the at least one spacer's width may taper, i.e., may reduce, in the direction from the semiconductor substrate 5 towards the upper surface of the replacement gate structure 4.

The protective dielectric layer may be comprised of a dielectric material, such as a nitride, e.g., silicon nitride. In one embodiment, the protective dielectric layer may be comprised of a low-k dielectric material, which typically has a dielectric constant that is less than 4.0, e.g., 3.9. In one embodiment, the protective dielectric layer 18 is comprised of a low-k dielectric material having a dielectric constant ranging from 1.75 to 3.5. Examples of materials suitable for low-k dielectric include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

It is noted that the material of the at least one spacer that provides the protective dielectric layer 18 is selected to protect the subsequently formed functional gate structure during the process steps that provide the opening for the contact. For example, the spacer may be a nitride, such as silicon nitride, when the subsequently formed protective cap structure is composed of a nitride, such as silicon nitride, and the subsequently formed mandrel dielectric is composed of boron phosphorus silicate glass (BPSG).

Metal semiconductor alloy regions 14 may be formed atop the source regions 10 and the drain regions 15. A "metal semiconductor alloy" is an alloy of a metal and a semiconductor. In one embodiment, the metal semiconductor alloy regions 14 are composed of a silicide. Silicide formation typically requires depositing a metal layer onto the surface of a Si-containing material or wafer. The metal layer may be deposited by at least one of chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof. Following deposition, the structure is subjected to an annealing step, which may include rapid thermal annealing. During annealing, the deposited metal reacts with Si forming a metal silicide. The metal semiconductor alloy 14 may also be a germinide, i.e., germanium and silicon alloy.

A passivation layer 6 may be formed in direct contact with an upper surface of the metal semiconductor alloy regions 14, the isolation regions 20, and a sidewall surface of the protective dielectric layer 18. The passivation layer 6 may be formed using thermal growth, e.g., thermal oxidation, or deposition processes, e.g., chemical vapor deposition. The passivation layer 6 may be composed of an oxide, nitride or oxynitride material. In one embodiment, the passivation layer 6 is composed of silicon oxide. The passivation layer 6 may have a thickness ranging from 3.0 nm to 25.0 nm.

FIG. 1 further depicts one embodiment of forming a mandrel dielectric layer 25 overlying the source region 10 and the drain region 15 of the substrate 5. In one embodiment, the mandrel dielectric layer 25 has an upper surface that is coplanar with an upper surface of the replacement gate structure 4. In one embodiment, the composition for the mandrel dielectric layer 25 is selected to protect the subsequently formed functional gate structure during the process steps that provide the opening for the contact.

The mandrel dielectric layer 25 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, $\alpha$-C:H). Additional choices for the mandrel dielectric layer 25 include: any of the aforementioned materials in porous form, or in a form that changes during processing to or from being porous and/or permeable to being non-porous and/or non-permeable. The blanket layer of the mandrel dielectric layer 25 may be formed by deposition processes, including, but not limited to spinning from solution, spraying from solution, chemical vapor deposition (CVD), plasma enhanced CVD (PECVD), sputter deposition, reactive sputter deposition, ion-beam deposition, and evaporation.

In one embodiment, the mandrel dielectric layer 25 is planarized until the upper surface of the replacement gate structure 4 has been exposed. Planarization is a material removal process that employs at least mechanical forces, such as frictional media, to produce a planar surface. One example of planarization is chemical mechanical planarization (CMP). Chemical mechanical planarization (CMP) is a material removal process using both chemical reactions and mechanical forces to remove material and planarize a surface.

Figure 2:
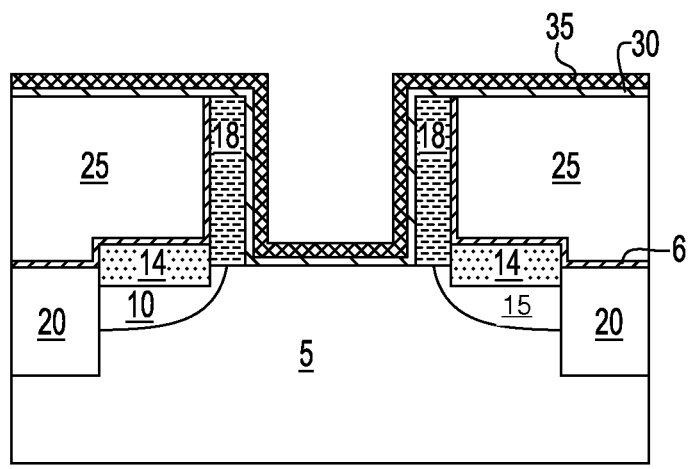
FIG. 2 is a side cross-sectional view depicting removing the replacement gate structure to provide an opening exposing the channel region of the substrate, forming a gate dielectric layer on at least the channel region of the substrate, and forming a work function metal layer on the gate dielectric layer, in accordance with one embodiment of the present disclosure.

FIG. 2 depicts removing the replacement gate structure 4 to provide an opening exposing the channel region of the substrate 5. The replacement gate structure 4 is typically removed using a selective etch process that removes the replacement gate structure 4 selective to the substrate 5, the mandrel dielectric layer 25, and the protective dielectric layer 18. The etch may be an isotropic etch, such as a wet etch, or an anisotropic etch, such as reactive ion etching.

An isotropic etch process is a material removal process in which the rate of the etching reaction is substantially similar in any direction. An anisotropic etch process is a material removal process in which the etch rate in the direction normal to the surface to be etched is much higher than in the direction parallel to the surface to be etched. "Reactive Ion Etching" is a form of plasma etching, in which during etching the surface to be etched is placed on the RF powered electrode, wherein the surface to be etched takes on a potential that accelerates the etching species extracted from a plasma towards the surfaces, to be etched, in which the chemical etching reaction is taking place in the direction normal to the surface.

In one embodiment, in which the replacement gate structure 4 is composed of polysilicon, the substrate 5 is a silicon-containing material, the mandrel dielectric 25 is composed of boron phosphorus silicate glass and the protective dielectric layer 18 is composed of silicon nitride, the wet etch chemistry may be composed of $NH_4OH$ or tetramethylammonium hydroxide (TMAH).

FIG. 2 further depicts forming a gate dielectric layer 30 on at least the channel region of the substrate 5, and forming a work function metal layer 35 on the gate dielectric layer 30. In one embodiment, the gate dielectric layer 30 is formed using a deposition process, such as chemical vapor deposition. Chemical Vapor Deposition (CVD) is a deposition process in which a deposited species is formed as a results of a chemical reaction between gaseous reactants at an elevated temperature (typically being greater than 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (EPCVD), Metal-Organic CVD (MOCVD) and others. In another embodiment, the gate dielectric layer 30 may be formed by a thermal growth process such as, for example, oxidation, nitridation or oxynitridation.

In one embodiment, the gate dielectric layer 30 is a conformal dielectric layer that is present on the sidewalls of the opening that is formed by removing the replacement gate structure and the base of the opening, i.e., channel region of the substrate 5. The conformal dielectric layer is also present on the upper surface of the mandrel dielectric 25 and the upper surface of the protective dielectric layer 18. The term "conformal" denotes a layer having a thickness that does not deviate from greater than or less than 30% of an average value for the thickness of the layer. The thickness of the gate dielectric layer 30 typically ranges from 1 nm to 10 nm. In one embodiment, the thickness of the gate dielectric layer 30 ranges from 2 nm to 5 nm.

The gate dielectric layer 30 may be composed of any dielectric including, but not limited to $SiO_2$; $Si_3N_4$; SiON; temperature sensitive high-k dielectrics such as $TiO_2$, $Al_2O_3$, $ZrO_2$, $HfO_2$, $Ta_2O_5$, $La_2O_3$; and other like oxides including perovskite-type oxides.

The gate dielectric layer 30 may also be a high-k dielectric. The high-k dielectric may be composed of an oxide, a nitride, an oxynitride or combinations and multi-layers thereof. A high-k dielectric may be a material having a dielectric constant that is greater than the dielectric constant of silicon oxide. In one embodiment, the high-k dielectric is comprised of a material having a dielectric constant that is greater than 4.0, e.g., 4.1. In another embodiment, the high-k dielectric is comprised of a material having a dielectric constant greater than 7.0. In yet another embodiment, the high-k dielectric is comprised of a material having a dielectric constant ranging from greater than 4.0 to 30. The dielectric constants mentioned herein are relative to a vacuum.

Some examples of high-k dielectric materials suitable for the gate dielectric layer 30 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one example, the gate dielectric layer 30 has a thickness ranging from 1.0 nm to 10.0 nm. In another example, the gate dielectric layer 30 may have a thickness ranging from 2.5 nm to 5.0 nm. In one embodiment, the gate dielectric layer 30 is hafnium oxide (HfO$_2$). In one embodiment, gate dielectric layer 30 is a multi-layered structure that is composed of a high-k dielectric layer and a metal nitride gate dielectric. In one embodiment, the metal nitride gate dielectric is composed of WN, WSiN, TiN, TiSiN, TaN, TaSiN, TiTaN, TaRuN or combinations thereof.

The work function metal layer 35 may be conformally deposited on the gate dielectric layer 30. In one embodiment, in which the gate dielectric layer 30 is composed of a high-k material, the work function metal layer 35 is in direct contact with the portion of the high-k gate dielectric layer 30 that is present on the channel portion of the substrate 5, and the work function metal layer 35 is in direct contact with the portion of the high-k gate dielectric layer 30 that is present on the sidewall portion of opening that is produced by removing the replacement gate structure 4. The thickness of the work function metal layer 35 typically ranges from 1.0 nm to 10.0 nm. In another example, the thickness of the work function metal layer 35 may range from 2.5 nm to 5.0 nm.

When forming a p-type semiconductor device, such as a p-type field effect transistor (pFET), the work function metal layer 35 may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer is composed of titanium aluminum nitride (TiAlN). In one example, the titanium content of the titanium aluminum nitride (TiAlN) may range from 20 wt % to 80 wt %, the aluminum content of the titanium aluminum nitride may range from 20 wt % to 60 wt %, and the nitrogen content of the titanium aluminum nitride may range from 20 wt % to 60 wt %. In another example, the titanium content of the titanium aluminum nitride (TiAlN) may range from 30 wt % to 60 wt %, the aluminum content of the titanium aluminum nitride may range from 25 wt % to 40 wt %, and the nitrogen content of the titanium aluminum nitride may range from 25 wt % to 50 wt %.

In one embodiment, a sputtering deposition process for depositing titanium aluminum nitride (TiAlN) includes applying high energy particles to strike a solid slab of a titanium aluminum alloy target material, in which the high energy particles physically dislodge atoms of titanium and aluminum to be deposited on at least the gate dielectric layer 30. In another embodiment, the sputtering apparatus may include dual targets, e.g., a first target composed of titanium and a second target composed of aluminum. The sputtered atoms of titanium and aluminum typically migrate through a vacuum and deposit on the deposition surface. In one example, the ion energies of the high-energy particles, e.g., positive ions from an argon gas flow discharge range from 500 eV to 5,000 eV. In another embodiment, the ion energies of the high-energy particles range from 1,500 eV to 4,500 eV.

Other materials that are suitable for providing the p-type work function metal layer include TaC, TaNC, Ru, and TiNi.

When forming an n-type semiconductor device, such as an n-type field effect transistor (pFET), the work function metal layer 35 may be an n-type work function metal layer.

In one embodiment, the work function of the n-type work function metal layer ranges from 4.1 eV to 4.3 eV. As used herein, a "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons.

In one embodiment, the n-type work function metal layer is composed of TiN. In one embodiment, a sputtering deposition process for depositing titanium nitride (TiN) includes applying high energy particles to strike a solid slab of a titanium nitride target material, in which the high energy particles physically dislodge particles of titanium nitride to be deposited on at least the gate dielectric layer 30. In another embodiment, TiN is sputtered from a solid titanium target, in which the nitrogen content of the metal nitride layer is introduced by a nitrogen gas.

The sputtered atoms of titanium and nitrogen typically migrate through a vacuum and deposit on the gate dielectric layer 30. In one example, the ion energies of the high-energy particles, e.g., positive ions from an argon gas flow discharge range from 500 eV to 5,000 eV. In another embodiment, the ion energies of the high-energy particles range from 1,500 eV to 4,500 eV. Other materials that are suitable for providing the n-type work function metal layer include TiN, TiAl, TiAl/TiN, AlN/TiN or combinations thereof.

Figure 3:
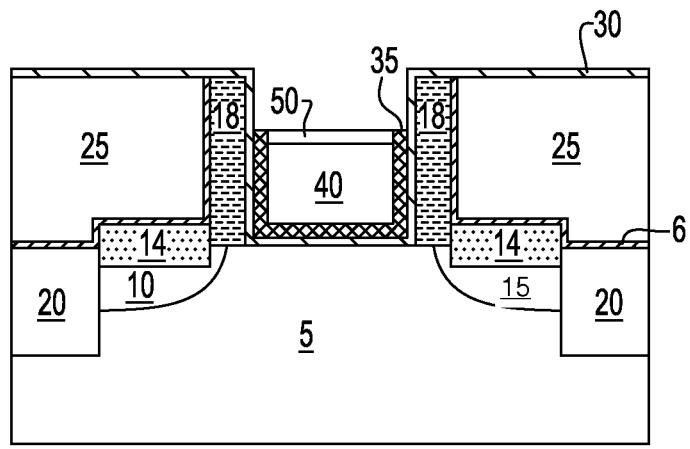
FIG. 3 is a side cross-sectional view depicting forming a metal fill material on the work function metal layer thus forming a functional gate structure, in accordance with one embodiment of the present disclosure.

FIG. 3 depicts forming a metal fill material 40 on the work function metal layer 35. In one embodiment, the metal fill material 40 is composed of aluminum. In one embodiment, a sputtering deposition process for depositing the metal fill material 40 that is composed of aluminum includes applying high energy particles to strike a solid slab of high-purity aluminum target material, in which the high energy particles physically dislodge atoms of the aluminum to be deposited on the work function metal layer 35. In one example, the ion energies of the high-energy particles, e.g., positive ions from an argon gas flow discharge, range from 500 eV to 5,000 eV. In another embodiment, the ion energies of the high-energy particles range from 1,500 eV to 4,500 eV. In one embodiment, by "high-purity aluminum" it is meant that the aluminum content of the target material is greater than 99.5%. In some embodiments, the aluminum content of the target material may be as great as 99.9% with a remainder of incidental impurities. "Incidental impurities" denote any contamination of the target, i.e., aluminum. Allowable ranges of impurities are less than 0.05 wt % for each impurity constituent, and 0.1 wt % for total impurity content. The sputtered aluminum atoms from the aluminum target may migrate through a vacuum and deposit on the deposition surface, e.g., the work function metal layer 35. In one example, iron (Fe), copper (Cu), and silver (Ag) may be present in less than 5 parts per million (ppm). The metal fill material 40 comprising aluminum may be planarized until an upper surface of the metal fill material 40 is coplanar with an upper surface of the mandrel dielectric layer 25. In one example, the planarization process is provided by chemical mechanical planarization (CMP).

The metal fill material 40, work function metal layer 35 and the gate dielectric layer 30 provide a functional gate structure. The term "functional gate structure" means a structure used to control output current (i.e., flow of carriers in the channel) of a semiconducting device through electrical or magnetic fields.

Still referring to FIG. 3, the metal fill material 40 may be recessed below the upper surface of the mandrel dielectric layer 25 and the protective dielectric layer 18. In one embodiment, the metal fill material 40 may be recessed using an etch process that is selective to the work function metal layer 35. The etch process may be an anisotropic etch, such reactive ion etch (RIE), or the etch process may be an isotropic etch, such as a wet etch.

In some embodiments, the etch chemistry that etches the metal fill material 40 selective to the work function metal layer 35 produces a surface dielectric layer 50, such as an oxide layer, on the recessed surface of the metal fill material 40. In one example, the surface dielectric layer 50 is composed of silicon oxide. The surface dielectric layer 50 may have a thickness ranging from 2 nm to 5 nm.

Still referring to FIG. 3, in one embodiment, the work function metal layer 35 may be removed from the upper surface of the mandrel dielectric layer 25, the upper surface of the protective dielectric layer 18, by a selective etch process. The selective etch process may also remove a portion of the work function metal layer 35 that is present on the sidewalls of an upper portion of the opening. The upper portion of the opening from which the work function metal layer 35 is removed extends to a depth that is substantially equal to or below the surface dielectric layer 50. A remaining portion of the work function metal layer 35 is present in a lower portion of the opening.

The etch process that removes the work function metal layer 35 may be an isotropic etch, such as a wet etch, or may be an anisotropic etch, such as reactive ion etch. In one embodiment, the etch chemistry that removes the work function metal layer 35 is selective to the gate dielectric layer 30 and the surface dielectric layer 50. In one embodiment, the etch chemistry that removes the work function metal layer 35 is composed of $NH_4OH:H_2O_2$.

Figure 4:
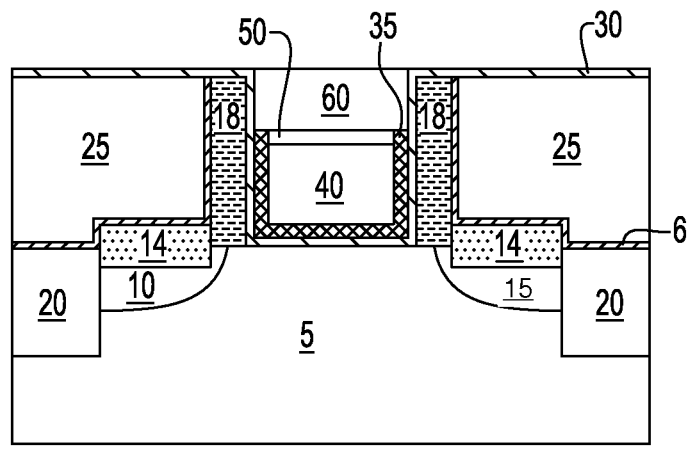
FIG. 4 is a side cross-sectional view depicting forming a protective cap structure over the functional gate structure, in accordance with one embodiment of the present disclosure.

FIG. 4 depicts forming a protective cap structure 60 over the functional gate structure. In one embodiment, the protective cap structure 60 is composed of a dielectric material, and fills the upper portion of the opening that is present over the recessed surface of the metal fill 40. The protective cap structure 60 may be composed of any dielectric material that can protect the functional gate from being damaged during the etch process that provides the openings to the source regions 10 and the drain regions 15. The protective cap structure 60 is typically composed of at least one of an oxide, nitride or oxynitride material. In one embodiment, in which the protective dielectric layer 18 is composed of a nitride, such as silicon nitride, and the mandrel dielectric layer 25 is composed of boron phosphorus silicate glass (BPSG), the protective cap structure 60 is composed of a nitride, such as silicon nitride.

The protective cap structure 60 may be formed by a deposition process including, but not limited to spinning from solution, spraying from solution, and chemical vapor deposition (CVD). Variations of CVD processes include, but are not limited to, Atmospheric Pressure CVD (APCVD), Low Pressure CVD (LPCVD) and Plasma Enhanced CVD (EPCVD), Metal-Organic CVD (MOCVD), high-density chemical vapor deposition (HDCVD) and others.

Figure 5:
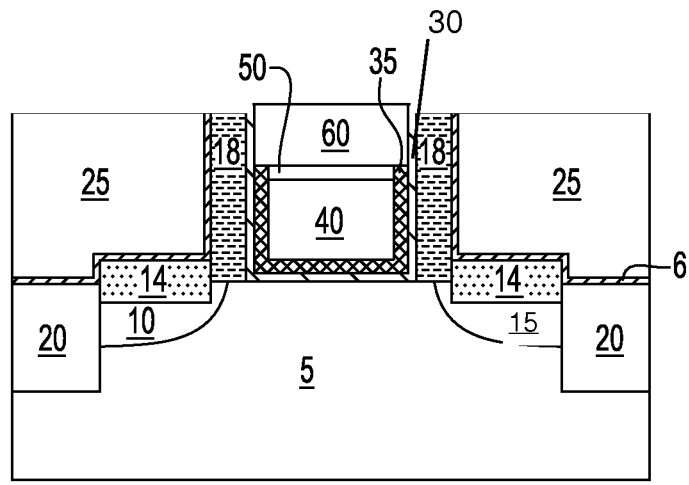
FIG. 5 is a side cross-sectional view depicting planarizing the structure depicted in FIG. 4 to remove at least the gate dielectric layer from an upper surface of the mandrel dielectric layer, in accordance with one embodiment of the present disclosure.

Following deposition, the dielectric material that provides the protective cap structure 60 may be planarized stopping on the gate dielectric layer 30 that is present on an upper surface of the mandrel dielectric layer 25. In one example, the planarization process is provided by chemical mechanical planarization (CMP). In some embodiments, the planarization process may be continued until the gate dielectric layer 30 is removed from the upper surface of the mandrel dielectric layer 25, as depicted in FIG. 5.

Figure 6:
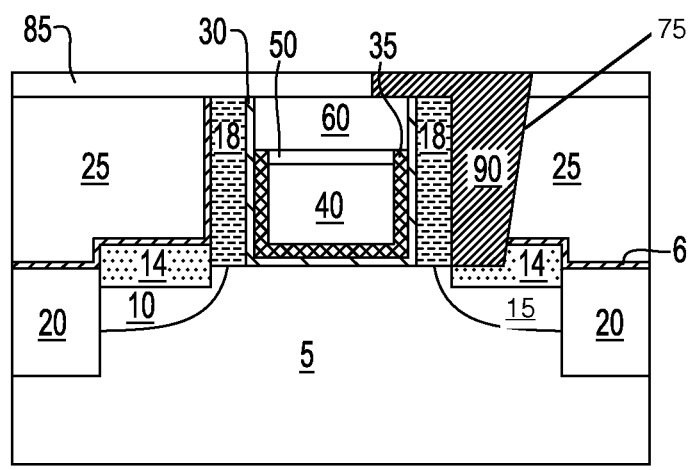
FIG. 6 is a side cross-sectional view depicting etching a via through the mandrel dielectric layer selective to the protective cap structure and the protective dielectric layer to expose at least one of the source region and the drain region, and filling the via to provide a contact to at least one of the source region and the drain region, in accordance with one embodiment of the present disclosure.

FIG. 6 depicting etching a via 75 through the mandrel dielectric layer 25 using an etch process that is selective to the protective cap structure 60 and the protective dielectric layer 18 to expose at least one of the source region 10 and the drain region 15. In the particular embodiment illustrated the via exposes the drain region. In another embodiment (not shown) the via exposes the source region 10. In some embodiments, prior to etching to form the via 75, an interlevel dielectric layer 85 is blanket deposited atop the structure depicted in FIG. 5.

Referring to the FIG. 6, the interlevel dielectric layer 85 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides; inorganic polymers; hybrid polymers; organic polymers such as polyamides or SiLK™, other carbon-containing materials; organo-inorganic materials such as spin-on glasses and silsesquioxane-based materials, and diamond-like carbon (DLC, also known as amorphous hydrogenated carbon, $\alpha$-C:H). Additional choices for the interlevel dielectric layer 85 include: any of the aforementioned materials in porous form, or in a form that changes during processing to or from being porous and/or permeable to being non-porous and/or non-permeable.

The interlevel dielectric layer 85 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The interlevel dielectric layer 85 and the mandrel dielectric layer 25 are then patterned and etched to form vias 75 to the source regions 10 and the drain regions 15 using patterning and selective etch process. More specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions to provide the vias 75. The vias 75 typically have a width ranging from 20 nm to 100 nm. In another embodiment, the vias 75 have a width ranging from 40 nm to 80 nm.

In one embodiment, the etch chemistry that provides the vias 75 removes at least the material of the mandrel dielectric layer 25 selective to the protective cap structure 60 and the protective dielectric layer 18, wherein the protective cap structure 60 and the protective dielectric layer 18 protect the functional gate structure from being damaged by the via 75 etch.

Following via formation, contacts 90 are formed by depositing a conductive metal into the vias 75 using deposition processing, such as CVD or plating. The conductive metal may include, but is not limited to tungsten, copper, aluminum, silver, gold, and alloys thereof. The contacts 90 are self-aligned to the diffusion regions, i.e., source regions 10 and drain regions 15, because the functional gate is protected from being damaged by the etch process that forms the vias 75 for the contacts 90 by the protective cap structure 60 that is present over the functional gate, and the protective dielectric layer 18 that is present on the sidewall of the functional gate.

Figure 7:
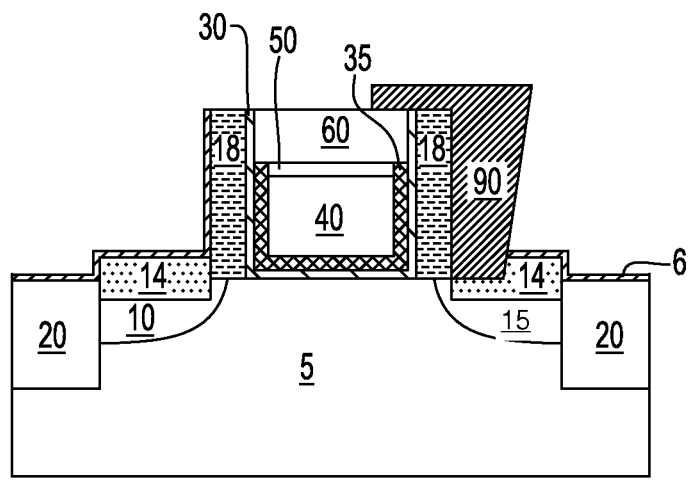
FIG. 7 is a side cross-sectional view depicting removing the mandrel dielectric layer, in accordance with one embodiment of the present disclosure.

FIG. 7 depicts one embodiment of removing the mandrel dielectric layer 25. The mandrel dielectric layer 25 may be removed by an etch process that removes the mandrel dielectric layer 25 selective to at least the contacts 90, the protective cap structure 60, the protective dielectric layer 18, and the passivation layer 6. The etch may be an isotropic etch, such as a wet etch, or an anisotropic etch, such as reactive ion etching.

Figure 8:
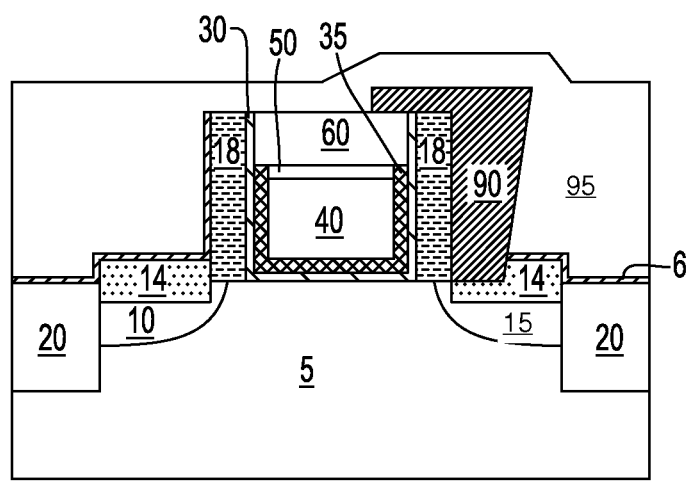
FIG. 8 is a side cross-sectional view depicting forming a stress-inducing layer overlying the functional gate structure, in accordance with one embodiment of the present disclosure.

FIG. 8 depicts forming a stress-inducing layer 95 overlying the functional gate structure. The term "stress inducing layer" denotes a material having an intrinsic stress, in which the intrinsic stress effectuates a stress in an underlying material. In one embodiment, the stress-inducing layer 95 may be a non-conformal layer. The term "non-conformal" denotes a layer having a thickness that deviates by greater than or equal to 30% of an average value for the thickness of the layer. The stress-inducing layer 95 is non-conformal because it is formed after the contacts 90 to the source regions 10 and drain regions 15. Typically, in prior methods and structures, the stress-inducing layer 95 is formed prior to forming the contacts.

The stress-inducing layer 95 may be a tensile stress-inducing layer or a compressive stress-inducing layer. In one embodiment, the stress-inducing layer 95 is a tensile stress-inducing layer that is formed overlying at least the functional gate to an n-type semiconductor device, e.g., n-type field effect transistor (nFET). The term "tensile stress inducing material" denotes a material layer having an intrinsic tensile stress, in which the intrinsic tensile stress produces a tensile stress in an underlying material. In another embodiment, the stress-inducing layer 95 is a compressive stress inducing layer that is formed overlying at least the functional gate to an p-type semiconductor device, e.g., p-type field effect transistor (pFET). The term "compressive stress inducing material" denotes a material having an intrinsic compressive stress, in which the intrinsic compressive stress produces a compressive stress in an underlying material.

The tensile stress-inducing layer may be any material that is capable of introducing a tensile stress into the device channel that is underlying the functional gate structure. Examples of such stress inducing materials, include, but are not limited to: $Si_3N_4$, SiC, silicon oxynitride and other like materials. Typically, the tensile stress inducing layer is comprised of $Si_3N_4$. The tensile stress inducing layer can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a modern metalorganic precursor for CVD applications.

Plasma enhanced chemical vapor deposition (PECVD) and high density chemical vapor deposition (HDCVD) are examples deposition method that can provide tensile stress inducing layer composed of nitride, e.g., silicon nitride, and having a tensile internal stress. The stress state of nitride-containing tensile stress inducing layer deposited by PECVD can be controlled by changing the deposition conditions to alter the reaction rate within the deposition chamber. More specifically, the stress state of a tensile stress inducing layer comprised of silicon nitride may be set by changing the deposition conditions such as: $SiH_4/N_2/He$ gas flow rate, pressure, RF power, and electrode gap. Rapid thermal chemical vapor deposition (RTCVD) can provide nitride-containing tensile stress inducing layer. The magnitude of the internal tensile stress produced within nitride-containing tensile stress inducing layer deposited by RTCVD can be controlled by changing the deposition conditions. More specifically, the magnitude of the tensile stress within strain tensile stress inducing layer comprised of silicon nitride may be set by changing deposition conditions such as: precursor composition, precursor flow rate and temperature. The tensile stress inducing layer may have an as-deposited thickness from 20 nm to 150 nm. In another embodiment, the as-deposited thickness of the tensile stress inducing layer ranges from 30 nm to 100 nm. The tensile stress inducing layer may include a stress having a magnitude ranging from 1 GPa to 1.6 GPa on the channel of the device.

The compressive stress inducing layer 22 may be any material that is capable of introducing a compressive stress into the device channel that is underlying the second gate stack 25. Examples of such stress inducing materials, include, but are not limited to: $Si_3N_4$, SiC, silicon oxynitride and other like materials. Typically, the compressive stress inducing layer 22 is comprised of $Si_3N_4$. The compressive stress inducing layer 22 can be formed utilizing various chemical vapor deposition (CVD) processes including, for example, low pressure CVD, plasma enhanced CVD, rapid thermal CVD, BTBAS-based ($C_8H_{22}N_2Si$ reacted with ammonia) CVD, where BTBAS is a modern metalorganic precursor for CVD applications.

Plasma enhanced chemical vapor deposition (PECVD) and high density chemical vapor deposition (HDCVD) are examples of depositions method that can provide a compressive stress inducing layer composed of nitride, e.g., silicon nitride, and having a compressive internal stress. The stress state of nitride-containing compressive stress inducing layer deposited by PECVD can be controlled by changing the deposition conditions to alter the reaction rate within the deposition chamber. More specifically, the stress state of a compressive stress inducing layer comprised of silicon nitride may be set by changing the deposition conditions such as: $SiH_4/N_2/He$ gas flow rate, pressure, RF power, and electrode gap. Although wishing not to be limited, it is believed that the incorporation of H into the nitride-containing compressive stress inducing layer increases the compressive nature of the layer. The compressive stress inducing layer may have an as-deposited thickness from 20 nm to 150 nm. In another embodiment, the as-deposited thickness of the compressive stress inducing layer ranges from 30 nm to 100 nm. The compressive stress inducing layer may include a stress having a magnitude ranging from 2 Gpa to 3 GPa on the channel of the device.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:

forming a protective dielectric layer on sidewalls of a replacement gate structure that is present over a channel region of a substrate;

forming a source region and a drain region on opposing sides of the replacement gate structure;

forming a mandrel dielectric layer overlying the source region and the drain region of the substrate, wherein the mandrel dielectric layer has an upper surface that is coplanar with an upper surface of the replacement gate structure;

removing the replacement gate structure to provide an opening exposing the channel region of the substrate;

forming a gate dielectric layer over the channel region and sidewalls of the opening;

forming a work function metal layer on the gate dielectric layer;

forming a metal fill material on the work function metal layer;

recessing the metal fill material, said recessing forming a surface dielectric layer on a recessed surface of a remaining portion of the metal fill material, wherein an upper surface of the surface dielectric layer is below the upper surface of the mandrel dielectric layer;

recessing vertical portions of the work function metal layer to form a U-shaped work function metal layer, wherein upper surfaces of the U-shaped work function metal layer are coplanar with or below the upper surface of the surface dielectric layer;

forming a protective dielectric cap structure over the upper surface of the surface dielectric layer and the upper surfaces of the U-shaped work function metal layer;

etching at least one via through the mandrel dielectric layer selective to the protective dielectric cap structure and the protective dielectric layer to expose a portion of at least one of the source region and the drain region; and forming a conductive fill in at least one via to provide a contact to the at least one of the source region and the drain region.

2. The method of claim 1 further comprising removing the mandrel dielectric layer, and forming a stress-inducing layer overlying the functional gate structure.

3. The method of claim 2, wherein the stress-inducing layer induces a compressive or tensile stress on the channel region of the substrate.

4. The method of claim 1 wherein forming the replacement gate structure overlying the channel region of the substrate comprises:

providing a substrate;

depositing a sacrificial layer on the substrate; and patterning the sacrificial layer to provide the replacement gate structure.

5. The method of claim 4, wherein the sacrificial layer comprises a dielectric layer; and patterning the sacrificial layer comprises forming photoresist mask overlying the dielectric layer and etching the dielectric layer selective to the photoresist mask and the substrate.

6. The method of claim 4, wherein the forming of the mandrel dielectric layer comprises depositing a dielectric layer having a composition to be etched selective to the protective dielectric layer and the protective dielectric cap, and planarizing the mandrel dielectric layer until an upper surface of the replacement gate structure is exposed.

7. The method of claim 1, wherein the forming of the source region and the drain region on opposing sides of the replacement gate structure comprises ion implantation to form n-type or p-type dopant regions into the substrate, and forming a metal semiconductor alloy material on the n-type or p-type dopant regions.

8. The method of claim 1, wherein the removing of the replacement gate structure to provide the opening exposing the channel region of the substrate comprises etching the replacement gate structure selective to the mandrel dielectric layer and the substrate.

9. The method of claim 1, wherein the forming of the gate dielectric layer comprises a conformal deposition of high-k dielectric material.

10. The method of claim 1, wherein the forming of the metal work function layer comprises a conformal deposition of a metal layer that effectuates an n-type threshold voltage shift or a metal layer that effectuates a p-type threshold voltage shift, wherein the metal work function layer is present on the portion of the high-k dielectric layer that is present on the channel region and is present on the portion of the high-k dielectric that is present on the sidewalls of the opening.

11. The method of claim 1, wherein the forming of the metal fill material on the work function metal layer comprises filling the opening with the metal fill material.

12. The method of claim 1, wherein after the recessing of the vertical portions of the metal work function layer that is present on the high-k dielectric layer that is present on the sidewalls of the opening, a remaining portion of the metal work function layer remains in a lower portion of the opening.

13. The method of claim 1, wherein the forming of the protective dielectric cap structure over the upper surface of the surface dielectric layer and the upper surfaces of the U-shaped work function metal layer comprises depositing a dielectric material to fill the upper portion of the opening.

14. The method of claim 1, wherein the etching at least one via through the mandrel dielectric layer selective to the protective cap structure and the protective dielectric layer comprises an anisotropic etch process.

* * * * *